United States Patent
Liou (10) Patent No.: US 7,659,594 B1
(45) Date of Patent: Feb. 9, 2010

(54) PHOTO SENSOR AND PORTABLE ELECTRONIC APPARATUS

(75) Inventor: Meng-Chi Liou, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 0 days.

(21) Appl. No.: 12/260,074

(22) Filed: Oct. 28, 2008

(30) Foreign Application Priority Data

Aug. 12, 2008 (TW) .............................. 97130699 A (51) Int. Cl.
*H01L 31/0224* (2006.01)

(52) U.S. Cl. .............................. 257/448; 257/E31.091; 257/E31.126

(58) Field of Classification Search .................... 257/59, 257/72, 448, 457, 459, 462, E31.053, E31.091, 257/E31.126
See application file for complete search history.

(56) References Cited

U.S. PATENT DOCUMENTS 6,809,718 B2   10/2004   Wei et al.

2007/0013823 A1   1/2007   Jung et al.
2007/0046619 A1   3/2007   Sano et al.
2009/0201042 A1*  8/2009   Sellathamby et al. ........ 324/763

* cited by examiner

*Primary Examiner*—Minh-Loan T Tran
*Assistant Examiner*—W. Wendy Kuo
(74) *Attorney, Agent, or Firm*—Jianq Chyun IP Office (57) ABSTRACT

A photo sensor including a gate, a first insulator, a semiconductor layer, a first electrode pattern layer, a second electrode pattern layer, a second insulator and a transparent electrode is provided. The gate is disposed on the substrate. The first insulator covers the gate and a portion of the substrate. The semiconductor layer is disposed on the first insulator above the gate. Moreover, there is a space between the first electrode pattern layer and the second electrode pattern layer located on the semiconductor layer. The second insulator covers a portion of the semiconductor layer, the first electrode pattern layer and the second electrode pattern layer. The transparent electrode is disposed on the second insulator above the semiconductor layer and corresponds to the first electrode pattern layer. The transparent electrode is electrically connected to the first electrode pattern layer, and a portion of the transparent electrode is within the space.

13 Claims, 6 Drawing Sheets

PHOTO SENSOR AND PORTABLE ELECTRONIC APPARATUS

CROSS-REFERENCE TO RELATED APPLICATION

This application claims the priority benefit of Taiwan application serial no. 97130699, filed on Aug. 12, 2008. The entirety of the above-mentioned patent application is hereby incorporated by reference herein and made a part of specification.

BACKGROUND OF THE INVENTION

1. Field of the Invention

The present invention relates to a photo sensor. More particularly, the present invention relates to a photo sensor of a portable electronic apparatus.

2. Description of Related Art

Figure 1:
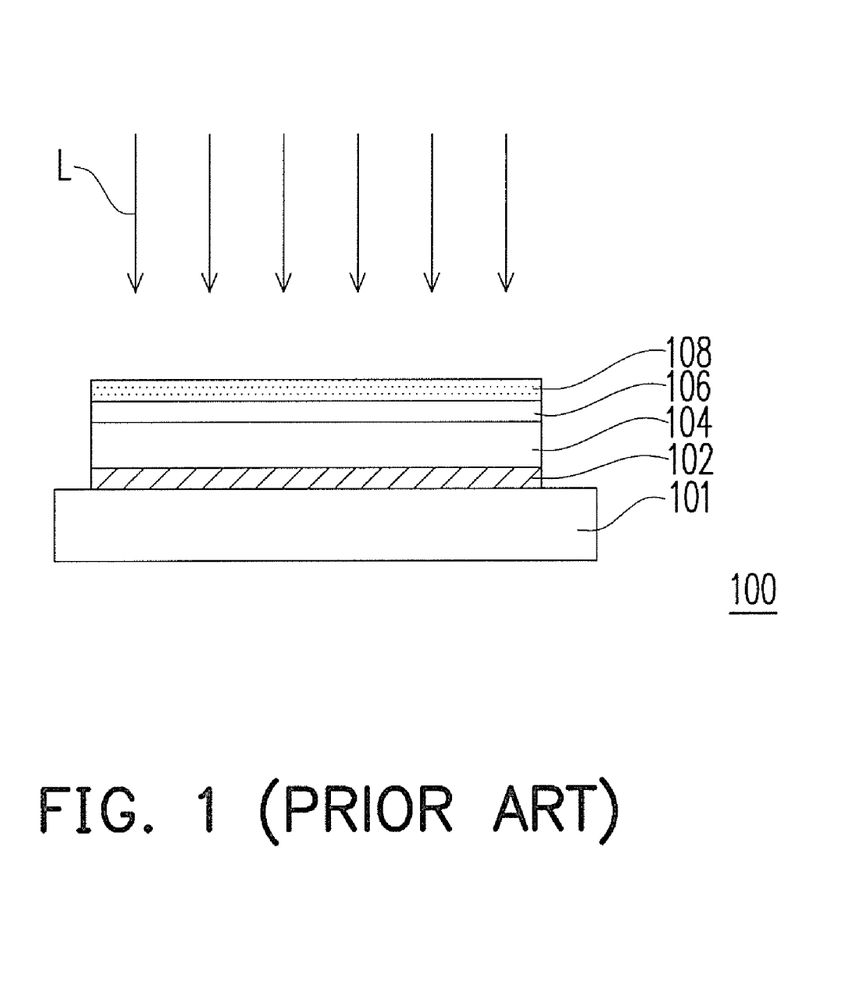
FIG. 1 is a cross-sectional view of a conventional photo sensor.

FIG. 1 is a cross-sectional view of a conventional photo sensor. Referring to FIG. 1, the conventional photo sensor 100 includes a substrate 101, a metal electrode 102, a semiconductor layer 104, a doped semiconductor layer 106 and a transparent electrode 108. Wherein, the metal electrode 102 is disposed on the substrate 101. Moreover, the semiconductor layer 104 and the doped semiconductor layer 106 are disposed between the metal electrode 102 and the transparent electrode 108. Material of the transparent electrode 108 can be indium tin oxide (ITO). The doped semiconductor layer 106 can be used for reducing impedance between the transparent electrode 108 and the semiconductor layer 104.

To be specific, the metal electrode 102 can be electrically connected to a low voltage, and the transparent electrode 108 can be electrically connected to a high voltage. Since the semiconductor layer 104 is formed by a photosensitive material, when an external light L passes through the transparent electrode 108 and irradiates the semiconductor layer 104 and the doped semiconductor layer 106, the semiconductor layer 104 absorbs photons to generate electron-hole pairs. The electrons and the holes respectively flow and migrate to the transparent electrode 108 and the metal electrode 102 during existing times thereof to form a photocurrent.

It should be noted that a fabrication process of the conventional photo sensor 100 cannot be integrated with a standard 5-mask process for fabricating an active device array substrate. This is because during the standard 5-mask fabrication process, a source/drain metal layer serves as a mask for fabricating an ohmic contact layer (doped semiconductor layer). In other words, during the standard 5-mask fabrication process, the Ohmic contact layer (doped semiconductor layer) cannot be successfully fabricated without the source/drain metal layer. However, in the conventional photo sensor 100, the transparent electrode 108 is located above the doped semiconductor layer 106, so that the doped semiconductor layer 106 cannot be formed during the standard 5-mask fabrication process. Moreover, the photo sensor 100 without the doped semiconductor layer 106 can be malfunctioned due to an excessive impedance. Therefore, how to integrate the photo sensor 100 onto the LCD panel is an essential subject to be developed.

SUMMARY OF THE INVENTION

Accordingly, the present invention is directed to a photo sensor, which can be integrated onto an active device array substrate and has a good photosensitivity.

The present invention is directed to a portable electronic apparatus, which can apply a photo sensor of the present invention to achieve a good display effect.

The present invention provides a photo sensor suitable for being allocated on a substrate. The photo sensor includes a gate, a first insulator, a semiconductor layer, a first electrode pattern layer, a second electrode pattern layer, a second insulator and a transparent electrode. The gate is disposed on the substrate. The first insulator covers the gate and a portion of the substrate. In addition, the semiconductor layer is disposed on the first insulator and correspondingly located above the gate. Moreover, the first electrode pattern layer and the second electrode pattern layer are disposed on the semiconductor layer, and there is a space between the first electrode pattern layer and the second electrode pattern layer, wherein the first electrode pattern layer is facing the second electrode pattern layer. The second insulator covers a portion of the semiconductor layer, the first electrode pattern layer and the second electrode pattern layer. The transparent electrode is disposed on the second insulator above the semiconductor layer and corresponds to the first electrode pattern layer. The transparent electrode is electrically connected to the first electrode pattern layer, and a portion of the transparent electrode is within the space.

In an embodiment of the present invention, the photo sensor further includes an ohmic contact layer disposed between the semiconductor layer and the first electrode pattern layer, and between the semiconductor layer and the second electrode pattern layer.

In an embodiment of the present invention, the photo sensor further includes a third insulator covering a portion of the second insulator and the transparent electrode.

In an embodiment of the present invention, the third insulator has a plurality of bumps corresponding to a region above the semiconductor layer.

In an embodiment of the present invention, the second insulator has a contact window opening, and the transparent electrode is electrically connected to the first electrode pattern layer via the contact window opening.

The present invention provides a portable electronic apparatus including a display screen and a plurality of photo sensors. The display screen has a backlight control circuit. The photo sensors are electrically connected to the backlight control circuit, and the photo sensors electrically connected to each other surround the display screen.

In an embodiment of the present invention, the first electrode pattern layers of the photo sensors are electrically connected to each other, the second electrode pattern layers are electrically connected to each other, and the gates are electrically connected to each other.

In an embodiment of the present invention, the portable electronic apparatus further includes a signal amplifier electrically connected between the backlight control circuit and the photo sensors.

In an embodiment of the present invention, the portable electronic apparatus further includes a signal processor electrically connected between the signal amplifier and the backlight control circuit.

According to the present invention, the transparent electrode electrically connected to the first electrode pattern layer may extend into the space between the first electrode pattern layer and the second electrode pattern layer, so as to improve intensity of an electric field, and effectively increase photocurrent generated by the photo sensor being irradiated from the light. A brightness level of a displayed image of the portable electronic apparatus applying the photo sensor of the present invention can be suitably adjusted according to environment lighting. Therefore, a display effect of the portable electronic apparatus of the present invention is good.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 2A:
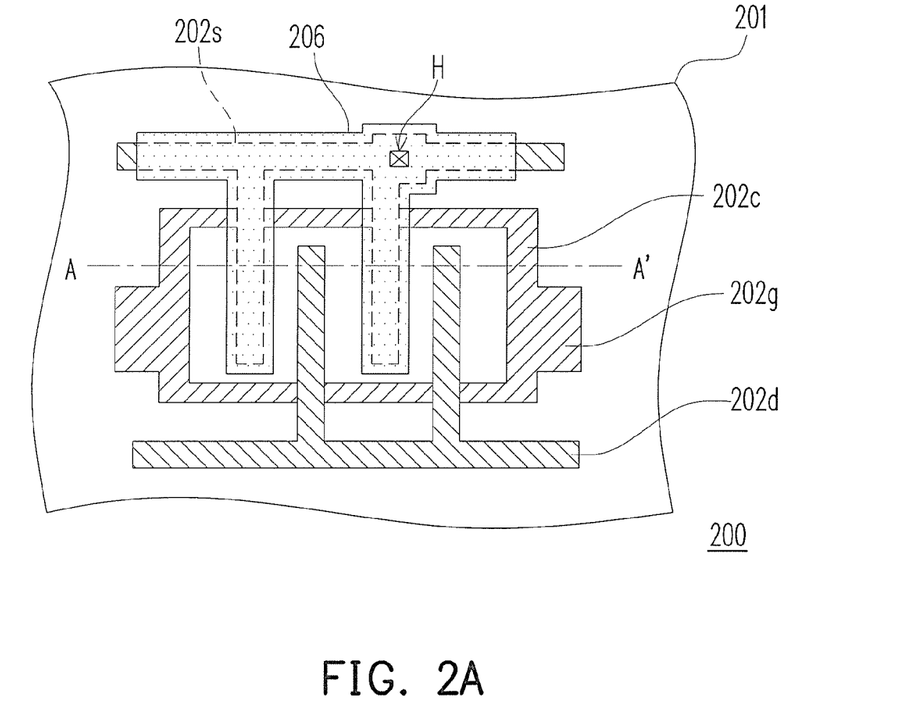
FIG. 2A is a top view of a photo sensor according to a first embodiment of the present invention.
Figure 2B:
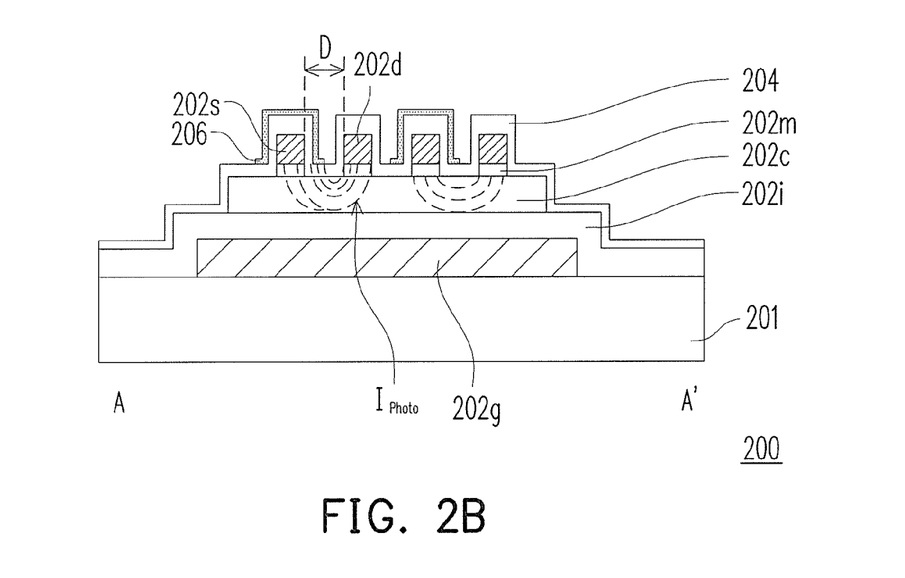
FIG. 2B is cross sectional view along a section line A-A' of FIG. 2A.

FIG. 2A is a top view of a photo sensor according to a first embodiment of the present invention, and FIG. 2B is cross sectional view along a section line A-A' of FIG. 2A. For simplicity, the first insulator, the second insulator and the third insulator are not illustrated in FIG. 2A, though these film layers are clearly illustrated in FIG. 2B. Referring to FIG. 2A and FIG. 2B, the photo sensor 200 of the present invention is disposed on a substrate 201, and the substrate 201 is for example, an active device array substrate. Generally, the active device array substrate is used together with a color filter substrate for fabricating a display panel. Certainly, a type of the substrate 201 can be changed according to an actual requirement, which is not limited by the embodiment.

As shown in FIG. 2B, the photo sensor 200 includes a gate 202g, a first insulator 202i, a semiconductor layer 202c, a first electrode pattern layer 202s, a second electrode pattern layer 202d, a second insulator 204 and a transparent electrode 206. The gate 202g is disposed on the substrate 201, and the first insulator 202i covers the gate 202g and a portion of the substrate 201. It should be noted that the active device array substrate generally includes a plurality of active devices, and gates (not shown) of the active devices can be formed based on a same mask with that of the gate 202g of the photo sensor 200, and extra mask process is unnecessary. Moreover, gate insulators (not shown) of the active devices can be formed together with the first insulator 202i of the present invention.

Moreover, the semiconductor layer 202c is disposed on the first insulator 202i above the gate 202g. In an actual application, the semiconductor layer 202c of the photo sensor 200 and channel of the active devices can be formed based on a same mask process, and extra mask process is unnecessary. To reduce contact impedance between a metal material and a semiconductor material, the photo sensor 200 further includes an ohmic contact layer 202m. The ohmic contact layer 202m can be disposed between the semiconductor layer 202c and the first electrode pattern layer 202s, and between the semiconductor layer 202c and the second electrode pattern layer 202d.

As shown in FIG. 2B, there is a space D between the first electrode pattern layer 202s and the second electrode pattern layer 202d, and the first electrode pattern layer 202s is facing the second electrode pattern layer 202d, wherein the distance of the space D is for example, 3 m. The smaller the distance of the space D is, the greater the intensity of an electric field generated between the first electrode pattern layer 202s and the second electrode pattern layer 202d is. It should be noted that the space D is limited by an exposure resolution utmost of an exposure tool. On the other hand, the first electrode pattern layer 202s and the second electrode pattern layer 202d of the photo sensor 200 and sources/drains (not shown) of the active devices can be formed based on a same mask process, and the extra mask process is unnecessary. Certainly, those skilled in the art should understand that patterns of the first electrode pattern layer 202s and the second electrode pattern layer 202d can be varied according to actual requirements, which is not limited by the embodiment.

The second insulator 204 covers the first electrode pattern layer 202s, the second electrode pattern layer 202d and a portion of the semiconductor layer 202c. It should be noted that the transparent electrode 206 is disposed on the second insulator 204 above the semiconductor layer 202c, and the transparent electrode 206 corresponds to the first electrode pattern layer 202s. The transparent electrode 206 and pixel electrodes (not shown) of the active devices can be formed based on a same mask process, and the extra mask process is unnecessary. As shown in FIG. 2A, the transparent electrode 206 is electrically connected to the first electrode pattern layer 202s via a contact window opening H. Here, description of the photo sensor 200 is completed, and according to the above description, fabrication process of the photo sensor 200 can be integrated to the fabrication process of a general active device array substrate, and the extra mask process is not required.

It should be noted that the intensity of the electric field generated between the first electrode pattern layer 202s and the second electrode pattern layer 202d is in inverse proportion to the distance of the space D. In the actual application, the distance of the space D is hard to be less than 3 m based on a general exposure resolution of the exposure tool. Therefore, as shown in FIG. 2B, a portion of the transparent electrode 206 electrically connected to the first electrode patter layer 202s extends into the space D. Accordingly, a distance between the transparent electrode 206 and the second electrode pattern layer 202d can be less than 3 um, and by shortening the distance, the intensity of the electric field can be improved. Meanwhile, a photocurrent $I_{photo}$ generated by the photo sensor 200 being irradiated from light can also be effectively increased.

Figure 2C:
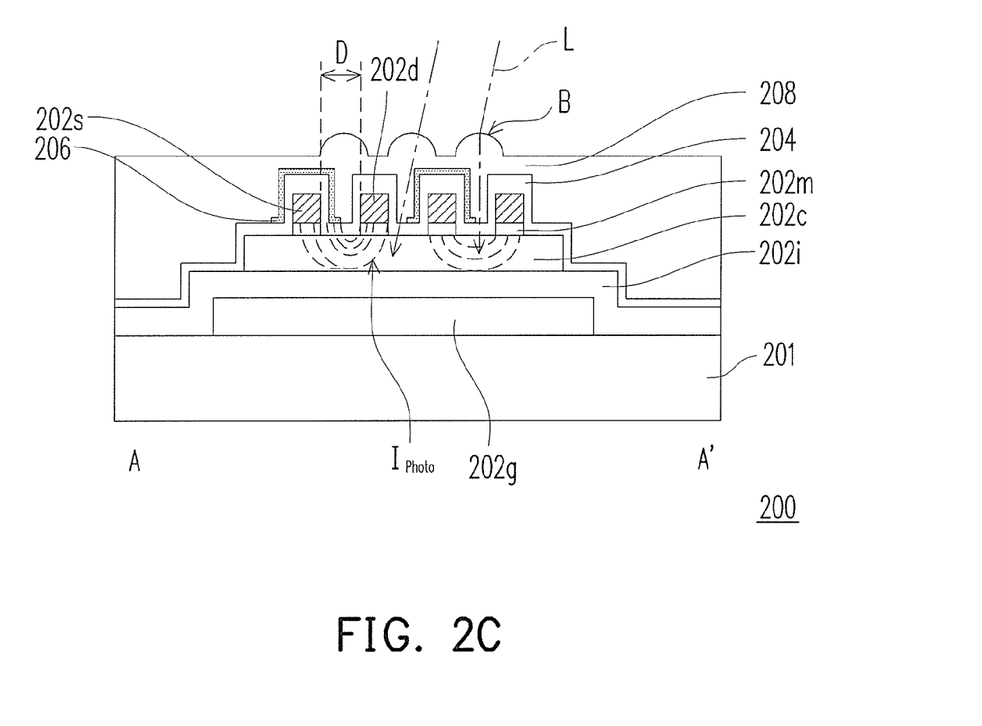
FIG. 2C is a cross-sectional view of another photo sensor according to an embodiment of the present invention.

To further improve a utility rate of external light, as shown in FIG. 2C, the photo sensor 200 further includes a third insulator 208. The third insulator 208 covers the transparent electrode 206 and a portion of the second insulator 204. Particularly, the third insulator 208 has a plurality of bumps B corresponding to a region above the semiconductor layer 202c. By such means, the external light L from different directions can be refracted by the bumps B and enters the semiconductor layer 202c, so as to effectively improve the utility rate of light.

Second Embodiment

Figure 3A:
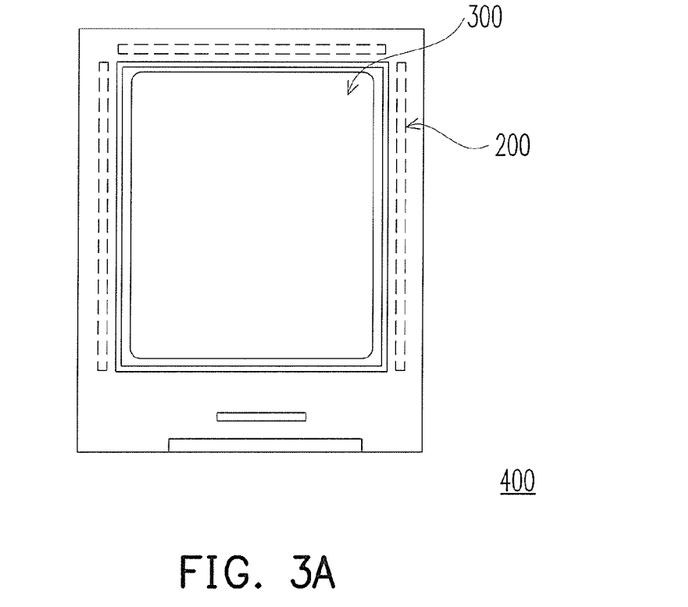
FIG. 3A is a schematic diagram illustrating a portable electronic apparatus according to a second embodiment of the present invention.
Figure 3B:
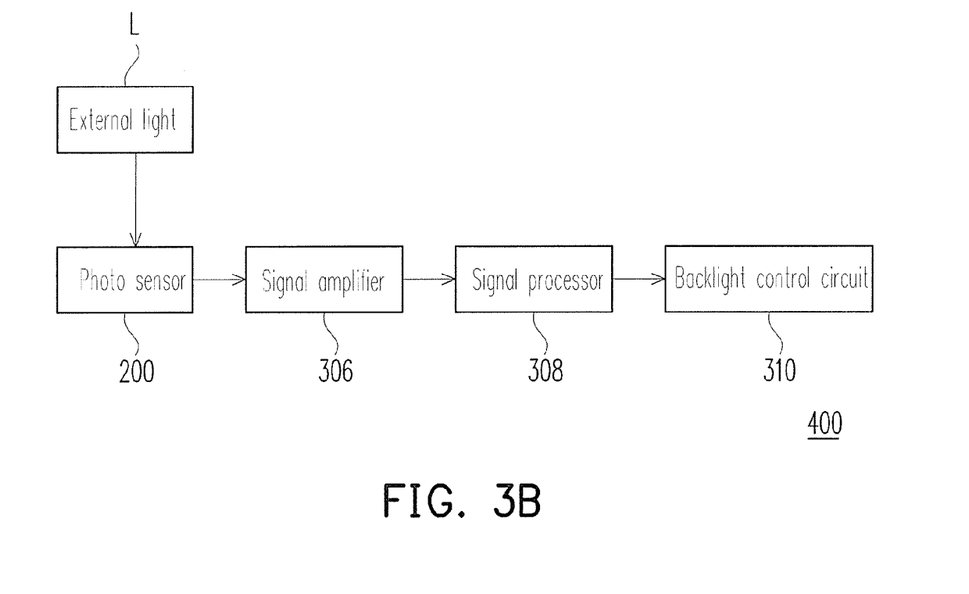
FIG. 3B is flowchart illustrating an operation of the portable electronic apparatus according to the second embodiment.
Figure 4A:
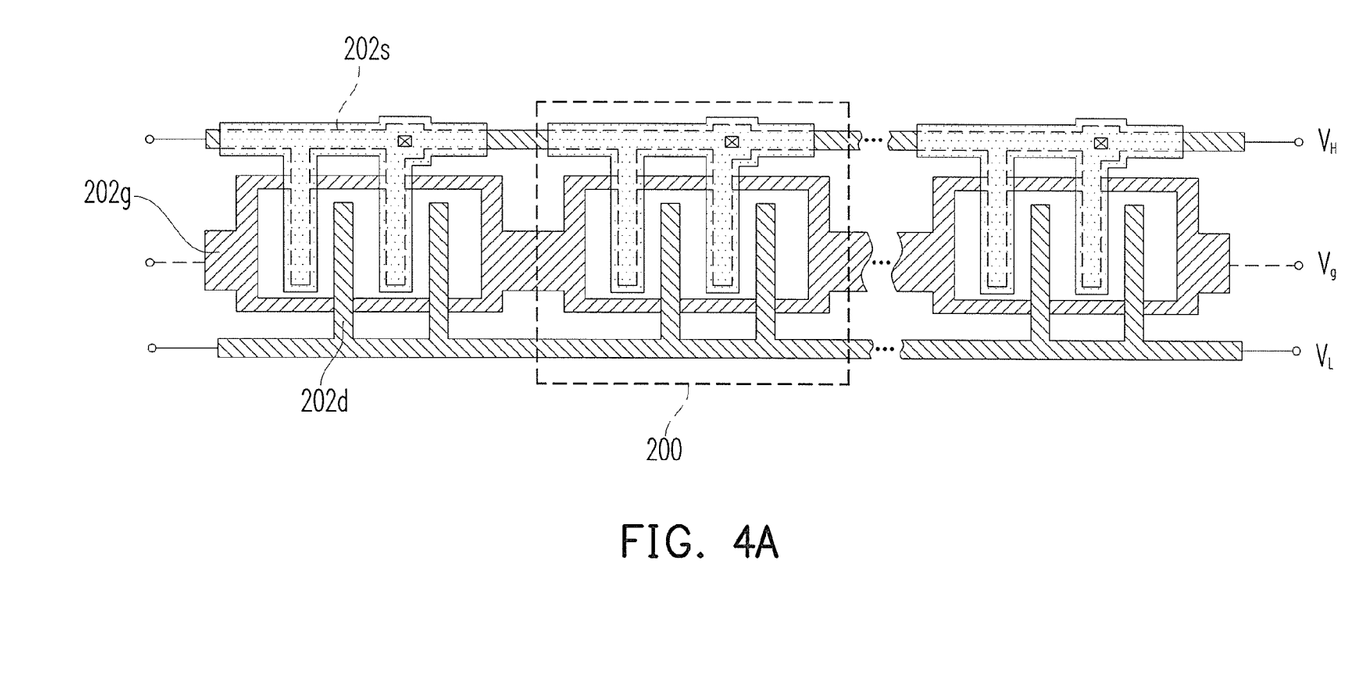
FIG. 4A is a schematic diagram illustrating a connection approach of photo sensors according to a second embodiment of the present invention.
Figure 4B:
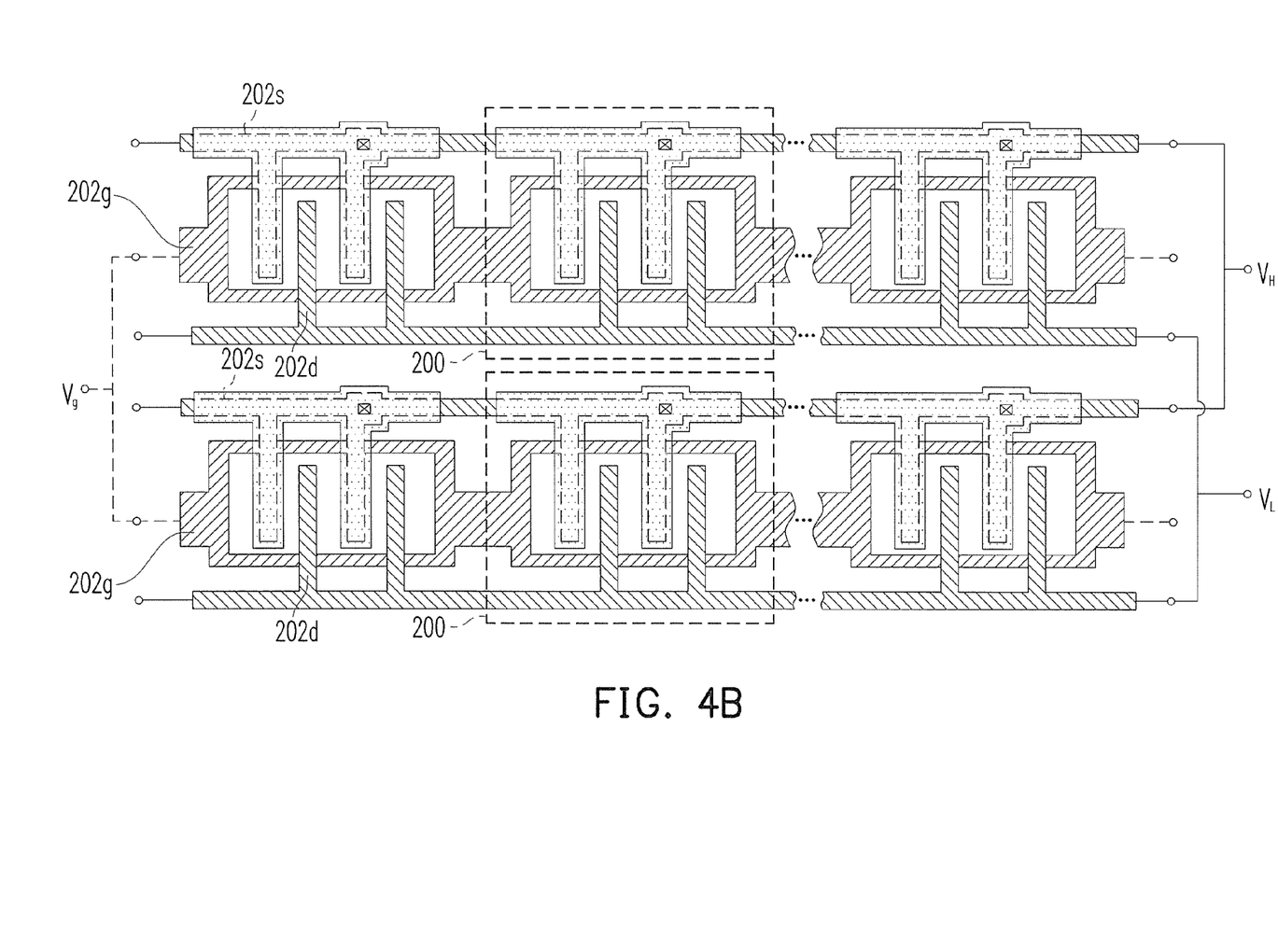
FIG. 4B is a schematic diagram illustrating another connection approach of photo sensors according to a second embodiment of the present invention.

FIG. 3A is a schematic diagram illustrating a portable electronic apparatus according to a second embodiment of the present invention. FIG. 3B is flowchart illustrating an operation of the portable electronic apparatus according to the second embodiment. Referring to FIG. 3A and FIG. 3B, the portable electronic apparatus 400 of the present invention includes a plurality of photo sensors 200 and a display screen 300. The photo sensors 200 surround the display screen 300 for detecting the external light. Particularly, a connection approach of the photo sensors 200 avails improvement of intensity of an output signal. As shown in FIG. 4A, the first electrode pattern layers 202s of the photo sensors 200 can be electrically connected to each other, the second electrode pattern layers 202d can be electrically connected to each other, and the gates 202g can also be electrically connected to each other. In the actual application, the gates 202g are commonly connected to a voltage $V_g$ of 5 volts for example. The first electrode pattern layers 202s are commonly connected to a voltage $V_H$ of 5 volts for example. The second electrode pattern layers 202d are commonly connected to a voltage $V_L$ of 0 volt for example. In an embodiment, the connection approach of the photo sensors 200 can be as that shown in FIG. 4B. The connection approach of the photo sensors 200 surrounding the display screen 300 can be varied according to actual requirements, which is not limited by the embodiment.

Moreover, as shown in FIG. 3B, the portable electronic apparatus 400 further includes a signal amplifier 306, a signal processor 308 and backlight control circuit 310. To highlight the output signal of the photo sensor 200, the photo sensor 200 can be sequentially connected to the signal amplifier 306, the signal processor 308 and the backlight control circuit 310. Certainly, the intensities of the output signals of the photo sensors 200 can be improved via different connection approaches thereof, and performance requirement of the signal amplifier 306 can be suitably reduced to save a fabrication cost.

To be specific, when the portable electronic apparatus 400 is irradiated by the external light L, the photo sensor 200 generates the photocurrent for outputting a signal to the signal amplifier 306 and the signal processor 308. After the backlight control circuit 310 receives the signal, intensity of the external light L is judged, and the displayed image is suitably adjusted according to the brightness the photo sensors 200 senses, so as to effectively improve a display quality of the image.

In summary, according to the present invention, the transparent electrode may extend into the space between the first electrode pattern layer and the second electrode pattern layer, and the smaller the distance between the transparent electrode and the second electrode pattern layer is, the more the intensity of the electric field is effectively improved and the more the photocurrent generated by the photo sensor being irradiated from the light is increased. A brightness level of a displayed image of the portable electronic apparatus applying the photo sensor of the present invention can be suitably adjusted according to environment lighting. Therefore, the display effect of the portable electronic apparatus of the present invention is good.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A photo sensor, suitable for being disposed on a substrate, comprising:
   a gate, disposed on the substrate;
   a first insulator, covering the gate and a portion of the substrate;
   a semiconductor layer, disposed on the first insulator above the gate;
   a first electrode pattern layer, disposed on the semiconductor layer;
   a second electrode patter layer, disposed on the semiconductor layer, wherein there is a space between the first electrode pattern layer and the second electrode pattern layer, and the first electrode pattern layer is opposite to the second electrode pattern layer;
   a second insulator, covering a portion of the semiconductor layer, the first electrode pattern layer and the second electrode pattern layer; and
   a transparent electrode, disposed on the second insulator above the semiconductor layer, and corresponding to the first electrode pattern layer, wherein the transparent electrode is electrically connected to the first electrode pattern layer, and a portion of the transparent electrode is within the space.

2. The photo sensor as claimed in claim 1, further comprising an ohmic contact layer disposed between the semiconductor layer and the first electrode pattern layer, and between the semiconductor layer and the second electrode pattern layer.

3. The photo sensor as claimed in claim 1, further comprising a third insulator covering a portion of the second insulator and the transparent electrode.

4. The photo sensor as claimed in claim 3, wherein the third insulator has a plurality of bumps corresponding to a region above the semiconductor layer.

5. The photo sensor as claimed in claim 1, wherein the second insulator has a contact window opening, and the transparent electrode is electrically connected to the first electrode pattern layer via the contact window opening.

6. A portable electronic apparatus, comprising:
   a display screen, having a backlight control circuit; and
   a plurality of photo sensors, electrically connected to the backlight control circuit, and the photo sensors being electrically connected to each other and surrounding the display screen, and each of the photo sensors comprising:
   a gate, disposed on the substrate;
   a first insulator, covering the gate and a portion of the substrate;
   a semiconductor layer, disposed on the first insulator above the gate;
   a first electrode pattern layer, disposed on the semiconductor layer;
   a second electrode patter layer, disposed on the semiconductor layer, wherein there is a space between the first electrode pattern layer and the second electrode pattern layer, and the first electrode pattern layer is facing the second electrode pattern layer;
   a second insulator, covering a portion of the semiconductor layer, the first electrode pattern layer and the second electrode pattern layer; and
   a transparent electrode, disposed on the second insulator above the semiconductor layer, and corresponding to the first electrode pattern layer, wherein the transparent electrode is electrically connected to the first electrode pattern layer, and a portion of the transparent electrode is within the space.

7. The portable electronic apparatus as claimed in claim 6, wherein the first electrode pattern layers of the photo sensors are electrically connected to each other, the second electrode pattern layers are electrically connected to each other, and the gates are electrically connected to each other.

8. The portable electronic apparatus as claimed in claim 6, further comprising a signal amplifier electrically connected between the backlight control circuit and the photo sensors.

9. The portable electronic apparatus as claimed in claim 8, further comprising a signal processor electrically connected between the signal amplifier and the backlight control circuit.

10. The portable electronic apparatus as claimed in claim 6, further comprising an ohmic contact layer disposed between the semiconductor layer and the first electrode pattern layer, and between the semiconductor layer and the second electrode pattern layer.

11. The portable electronic apparatus as claimed in claim 6, further comprising a third insulator covering a portion of the second insulator and the transparent electrode.

12. The portable electronic apparatus as claimed in claim 11, wherein the third insulator has a plurality of bumps.

13. The portable electronic apparatus as claimed in claim 6, wherein the second insulator has a contact window opening, and the transparent electrode is electrically connected to the first electrode pattern layer via the contact window opening.

* * * * *